(12) United States Patent
Kise et al.

(10) Patent No.: US 11,716,831 B2
(45) Date of Patent: Aug. 1, 2023

(54) ELECTRONIC DEVICE

(71) Applicant: Mitsubishi Electric Corporation, Tokyo (JP)

(72) Inventors: Koji Kise, Tokyo (JP); Hiroaki Ishikawa, Tokyo (JP); Takashi Moriyama, Tokyo (JP); Yuki Sakata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 188 days.

(21) Appl. No.: 17/437,047

(22) PCT Filed: Apr. 22, 2019

(86) PCT No.: PCT/JP2019/017077
§ 371 (c)(1),
(2) Date: Sep. 8, 2021

(87) PCT Pub. No.: WO2020/217285
PCT Pub. Date: Oct. 29, 2020

(65) Prior Publication Data
US 2022/0183184 A1 Jun. 9, 2022

(51) Int. Cl.
*H05K 7/20* (2006.01)
*H05K 1/02* (2006.01)
(Continued)

(52) U.S. Cl.
CPC ....... *H05K 7/20327* (2013.01); *H05K 1/0203* (2013.01); *H05K 1/14* (2013.01);
(Continued)

(58) Field of Classification Search
CPC .......... H05K 7/20309; H05K 7/20327; H05K 7/20272; H05K 1/0203; H05K 1/14; H01L 23/427; F28D 15/025; F28D 2021/0021
See application file for complete search history.

(56) References Cited

U.S. PATENT DOCUMENTS 3,481,393 A * 12/1969 Chu .................... H01L 25/03
165/104.31
4,644,385 A    2/1987 Nakanishi et al.
(Continued)

FOREIGN PATENT DOCUMENTS

DE   112014006676 T5 *  3/2017  .......... H01L 23/051
JP       60-94749 A      5/1985
(Continued)

OTHER PUBLICATIONS

International Search Report and Written Opinion dated Jul. 16, 2019, received for PCT Application PCT/JP2019/017077, Filed on Apr. 22, 2019, 10 pages including English Translation.

*Primary Examiner* — Zachary Pape
(74) *Attorney, Agent, or Firm* — Xsensus LLP

(57) ABSTRACT

A electronic device includes: a plurality of substrates each including a substrate main body and a heat generating element, the plurality of substrates being provided side by side in a plate thickness direction; a cooler which is provided between the substrates adjacent to each other, and configured to cool the heat generating element; and a piping which is made of metal, and is connected to the cooler. The piping includes: an inner piping portion which is arranged in an inter-substrate region, and is connected to the cooler; an inner piping extending portion provided so as to extend from the inner piping portion to an outer side of the inter-substrate region; and an outer piping portion which is arranged to be shifted from the inter-substrate region, and is connected to
(Continued)

the inner piping extending portion. The outer piping portion includes a movable piping portion that is deformable.

6 Claims, 13 Drawing Sheets

(51) Int. Cl.
    *H05K 1/14*     (2006.01)
    *F28D 15/02*     (2006.01)
    *F28D 21/00*     (2006.01)
    *H01L 23/427*     (2006.01)

(52) U.S. Cl.
    CPC ....... *H05K 7/20272* (2013.01); *F28D 15/025* (2013.01); *F28D 2021/0021* (2013.01); *H01L 23/427* (2013.01); *H05K 2201/064* (2013.01)

(56) References Cited

U.S. PATENT DOCUMENTS

| | | | |
|---|---|---|---|
| 5,465,192 A | 11/1995 | Yoshikawa | |
| 5,646,824 A | 7/1997 | Ohashi et al. | |
| 5,732,765 A * | 3/1998 | Drolen | F28D 15/043 165/41 |
| 5,966,957 A | 10/1999 | Mälhammar et al. | |
| 6,055,157 A * | 4/2000 | Bartilson | H05K 1/141 174/15.1 |
| 7,515,418 B2 * | 4/2009 | Straznicky | H01L 23/4338 361/699 |
| 2003/0189815 A1 * | 10/2003 | Lee | H01L 23/427 361/679.52 |
| 2008/0007914 A1 * | 1/2008 | Peng | G06F 1/20 257/E23.099 |
| 2010/0002393 A1 | 1/2010 | Campbell et al. | |
| 2018/0031329 A1 * | 2/2018 | Wang | G06F 1/203 |

FOREIGN PATENT DOCUMENTS

| | | |
|---|---|---|
| JP | 62-118553 A | 5/1987 |
| JP | 6-266474 A | 9/1994 |
| JP | 7-142656 A | 6/1995 |
| JP | 11-502300 A | 2/1999 |
| JP | 11-186478 A | 7/1999 |
| JP | 2004-11962 A | 1/2004 |
| JP | 2006-12875 A | 1/2006 |
| WO | 96/29553 A1 | 9/1996 |

* cited by examiner

ELECTRONIC DEVICE

CROSS-REFERENCE TO RELATED APPLICATION

The present application is based on PCT filing PCT/JP2019/017077, filed Apr. 22, 2019, the entire contents of which are incorporated herein by reference.

TECHNICAL FIELD

This invention relates to an electronic device including a cooler configured to cool a heat generating element.

BACKGROUND ART

Hitherto, there has been known an electronic device including a plurality of substrates, a cooler, and a flexible tube. The plurality of substrates each include a substrate main body, and a heat generating element provided on the substrate main body. The cooler is provided between the substrates adjacent to each other. The flexible tube is connected to the cooler. Refrigerant flows through the cooler via the flexible tube. The refrigerant flows through the cooler so that the cooler cools the heat generating element. A part of the flexible tube is inserted in between the substrates adjacent to each other. The flexible tube is made of a resin (see, for example, Patent Literature 1).

CITATION LIST

Patent Literature

[PTL 1] JP 6-266474 A

SUMMARY OF INVENTION

Technical Problem

However, the flexible tube is made of a resin. As a result, when pressure of the refrigerant is increased, the flexible tube is damaged. Thus, the pressure resistance of the piping, through which the refrigerant flows, against the refrigerant is low. When the piping is made of metal in order to improve the pressure resistance of the piping against the refrigerant, ease of assembling of the electronic device is lowered. When the piping made of metal is formed to be deformable in order to improve the ease of assembling of the electronic device, there is a problem in that a distance between the substrates adjacent to each other is increased, thereby increasing the size of the electronic device.

This invention has been made to solve the problems as described above, and has an object to provide an electronic device capable of improving the pressure resistance of a piping against refrigerant, improving ease of assembling of the electronic device, and reducing the size of the electronic device.

Solution to Problem

According to this invention, there is provided an electronic device, including: a plurality of substrates each including a substrate main body and a heat generating element provided on the substrate main body, the plurality of substrates being provided side by side in a plate thickness direction of the substrate main body; a cooler which is provided between the substrates adjacent to each other, and is configured to allow refrigerant to flow through the cooler, to thereby cool the heat generating element; and a piping which is made of metal, and is connected to the cooler, wherein the piping includes: an inner piping portion which is arranged in an inter-substrate region being a region between the substrates adjacent to each other, and is connected to the cooler; an inner piping extending portion provided so as to extend from the inner piping portion to an outer side of the inter-substrate region; and an outer piping portion which is arranged to be shifted from the inter-substrate region, and is connected to the inner piping extending portion, and wherein the outer piping portion includes a movable piping portion that is deformable.

Advantageous Effects of Invention

In the electronic device according to this invention, the piping made of metal is connected to the cooler, and the piping includes the outer piping portion including the movable piping portion. With this configuration, it is possible to improve the pressure resistance of the piping against the refrigerant, improve the ease of assembling of the electronic device, and to reduce the size of the electronic device.

DESCRIPTION OF EMBODIMENTS

First Embodiment

Figure 1:
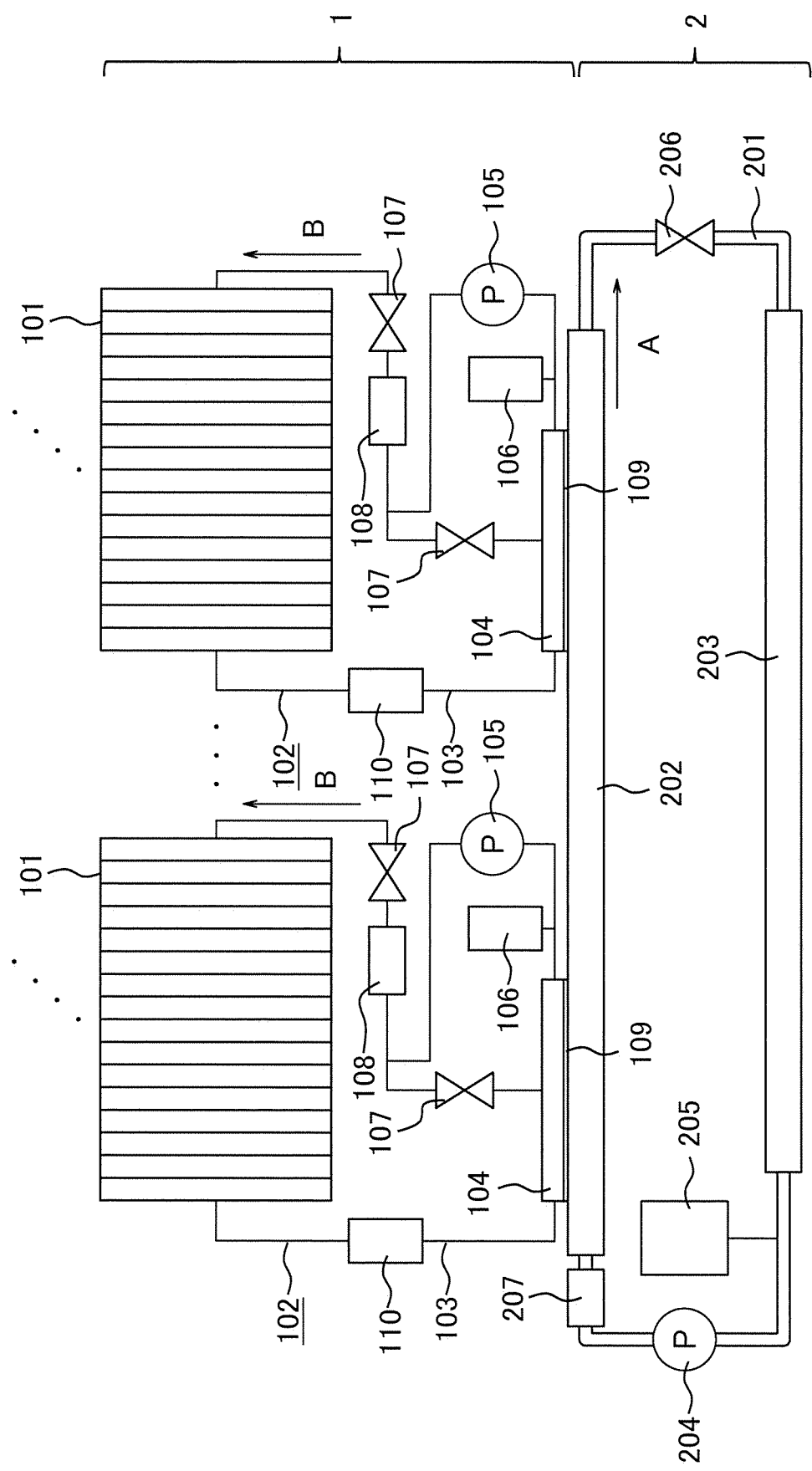
FIG. 1 is a configuration view for illustrating an electronic device system according to a first embodiment of this invention.

FIG. 1 is a configuration view for illustrating an electronic device system according to a first embodiment of this invention. The electronic device system includes an electronic device 1, and an entire cooling system 2 configured to cool the electronic device 1. The electronic device 1 includes a plurality of electronic device units 101, and a plurality of electronic device cooling systems 102 configured to cool the plurality of electronic device units 101, respectively. The entire cooling system 2 is configured to cool the plurality of electronic device units 101 via the plurality of electronic device cooling systems 102, respectively. In this example, the entire cooling system 2 is installed at a set position in advance.

The entire cooling system 2 includes a piping 201 through which refrigerant flows in a circulating manner, a heat receiving portion 202 which is connected to the piping 201 and through which the refrigerant flows, a heat release portion 203 which is connected to the piping 201 and through which the refrigerant flows, and a pump 204 configured to increase pressure of the refrigerant flowing through the piping 201. Further, the entire cooling system 2 includes an accumulator 205 configured to adjust the pressure of the refrigerant flowing through the piping 201, a valve 206 configured to open and close a flow passage for the refrigerant flowing through the piping 201, and a heater 207 configured to heat the refrigerant flowing through the piping 201.

The refrigerant flows through the piping 201 in a direction of the arrow A. The valve 206 opens and closes the flow passage for the refrigerant flowing through the piping 201 to adjust a flow rate of the refrigerant flowing through the piping 201. When a volume change due to thermal expansion or the like occurs in the refrigerant flowing through the piping 201, the accumulator 205 adjusts a change in the pressure of the refrigerant flowing through the piping 201.

In a case in which a flow of the refrigerant flowing through the piping 201 is a single-phase flow, air or refrigerant vapor is present inside the accumulator 205. For example, when the refrigerant flowing through the piping 201 is expanded due to thermal expansion, a region in the accumulator in which gas is arranged is compressed. With this configuration, rupture of the piping 201 is prevented. In a case in which the flow of the refrigerant flowing through the piping 201 is a two-phase flow, the entire inside the piping 201 is deaerated, and then, refrigerant is injected into the piping 201. The accumulator 205 is deaerated so that air is removed from the inside of the accumulator 205. Thus, only vapor is present inside the accumulator 205. The vapor inside the accumulator 205 is heated using a heater or the like or the vapor is cooled, thereby adjusting a volume of the vapor. With this configuration, the entire pressure of the refrigerant is adjusted. The entire cooling system 2 may be a heat transport device using a single-phase flow pump or a two-phase flow pump, or a heat transport device (not shown) not using a pump, such as a heat piping.

Heat generated in the electronic device unit 101 is transferred to the heat receiving portion 202 via the electronic device cooling system 102. The heat having been transferred to the heat receiving portion 202 is transferred to the heat release portion 203 via the refrigerant flowing through the piping 201. The heat having been transferred to the heat release portion 203 is released to a periphery of the heat release portion 203. With this configuration, the entire cooling system 2 cools the electronic device unit 101.

The electronic device cooling system 102 includes a piping 103 connected to the electronic device unit 101 and through which refrigerant flows in a circulating manner, a heat release portion 104 which is connected to the piping 103 and through which the refrigerant flows, and a pump 105 configured to increase pressure of the refrigerant flowing through the piping 103. Further, the electronic device cooling system 102 includes an accumulator 106 configured to adjust the pressure of the refrigerant flowing through the piping 103, a valve 107 configured to open and close a flow passage for the refrigerant flowing through the piping 103, and a heater 108 configured to heat the refrigerant flowing through the piping 103. Further, the electronic device cooling system 102 includes a heat transfer sheet 109 provided between the heat release portion 104 and the heat receiving portion 202, and a power source 110 to be cooled by the refrigerant flowing through the piping 103. A current is supplied to each of the pump 105 and the heater 108 by the power source 110. Further, the current is supplied to the electronic device unit 101 by the power source 110.

The refrigerant flows through the piping 103 in a direction of the arrow B. The valve 107 opens and closes the flow passage for the refrigerant flowing through the piping 103, thereby adjusting a flow rate of the refrigerant flowing through the piping 103. In a case in which the flow of the refrigerant is a single-phase flow, when a volume change due to thermal expansion or the like occurs in the refrigerant flowing through the piping 103, the pressure of the refrigerant flowing through the piping 103 is adjusted by gas inside the accumulator 106 being compressed or expanded. When a temperature of the refrigerant flowing through the piping 103 is lower than a set value, the heater 108 heats the refrigerant flowing through the piping 103. With this configuration, the temperature of the refrigerant flowing through the piping 103 is adjusted.

The heat generated in the electronic device unit 101 is transferred to the heat release portion 104 via the refrigerant flowing through the piping 103. The heat having been transferred to the heat release portion 104 is transferred to the heat receiving portion 202 via the heat transfer sheet 109. With this configuration, the heat generated in the electronic device unit 101 is transferred to the entire cooling system 2.

The power source 110 is cooled by the refrigerant flowing through the piping 103. The power source 110 may be directly cooled by, for example, the heat receiving portion 202. In this case, for example, a heat conductive sheet or a heat conductive resin may be arranged between the heat receiving portion 202 and the power source 110. Further, heat generated in the power source 110 may be directly released to a periphery of the power source 110 to cool the power source 110.

The heat having been transferred to the heat release portion 104 is transferred to the entire cooling system 2, and the heat having been transferred to the entire cooling system 2 is released to the periphery of the heat release portion 203. The heat having been transferred to the heat release portion 104 may be released to a periphery of the heat release portion 104.

When a periphery of the electronic device 1 is in an on-Earth environment, the electronic device 1 is often designed with a maximum value of an ambient temperature of the electronic device 1 being set to about 50° C. When the ambient temperature of the electronic device 1 is about 50° C., the electronic device 1 is often designed assuming that the temperature of the refrigerant flowing through the piping 103 is from about 50° C. to about 60° C. Thus, in the on-Earth environment, water which has no toxicity, and is easy to handle is used as the refrigerant flowing through the piping 103.

When the external ambient temperature is low, refrigerant which does not solidify even at low temperature is used as the refrigerant flowing through the piping 103. As examples of the refrigerant in this case, ammonia and a fluorocarbon refrigerant are given, and further, flammable refrigerants such as methane, ethane, and propane are given. Those refrigerants have a higher saturated vapor pressure than water at the same temperature.

For example, ammonia turns to gas when the pressure is atmospheric pressure, and further, the temperature is normal temperature. Ammonia turns to liquid by increasing pressure of the ammonia. Ammonia at a temperature of 50° C. has a saturated vapor pressure of about 20 atm. Thus, when liquid ammonia is used as the refrigerant, it is required to design the electronic device 1 so as to be capable of resisting a pressure of refrigerant of about 20 atm.

Ammonia has an irritating odor. Thus, it is required to pay attention to leakage of the ammonia as compared to the case of water. It is also required to pay attention to leakage of flammable refrigerant. When fluorocarbon refrigerant leaks, the environment is damaged. Thus, it is required to pay attention to leakage of the refrigerant as compared to the case of using water. In view of those, it is required that the piping 103 be made of not a resin but be metal.

Figure 2:
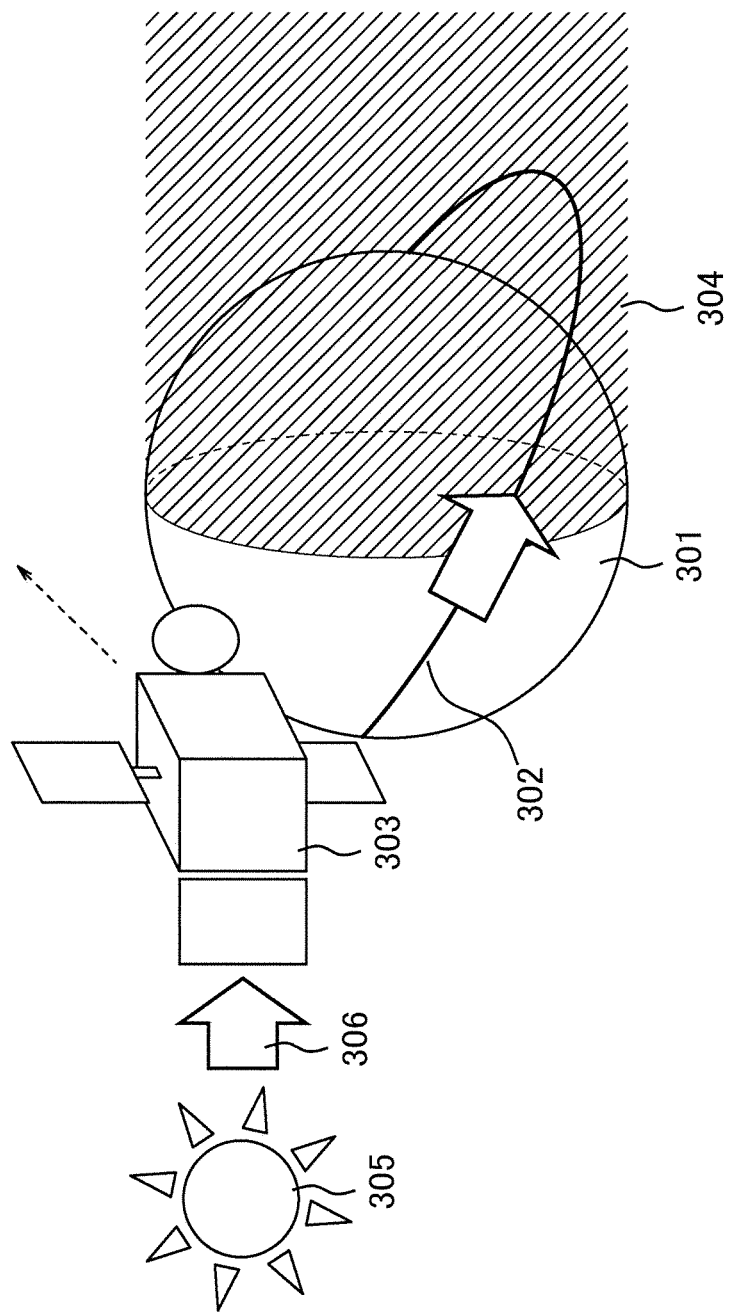
FIG. 2 is a schematic view for illustrating an artificial satellite.

Next, a case in which ammonia is used as the refrigerant is described. FIG. 2 is a schematic view for illustrating an artificial satellite in which the electronic device 1 is installed. An artificial satellite 303 goes around an orbit 302 around an earth 301. When the artificial satellite 303 goes around the orbit 302, and the artificial satellite 303 enters a shade region 304 so that a heat 306 of a sun 305 is not radiated onto the artificial satellite 303, a temperature of refrigerant inside the artificial satellite 303 reduces.

An ambient temperature of aerospace is about −270° C. Thus, the temperature of the refrigerant flowing through the piping 103 can be lowered within a range in which the electronic device 1 is not broken. Thus, ammonia is often used as refrigerant flowing through the piping 103, which has high pressure, and is not solidified until about −87° C.

Further, when an amount of heat generated by the electronic device 1 is small, it may be required to heat the electronic device 1 using a heater or the like in order to keep the temperature of the electronic device 1 at such a temperature that the electronic device 1 is not broken.

When the heat 306 of the sun 305 is radiated onto the artificial satellite 303, a temperature of a medium inside the artificial satellite 303 increases. It is required to suppress the temperature of the electronic device 1 to a maximum allowable temperature or less. The maximum allowable temperature of the electronic device 1 is generally from 100° C. to 125° C. In this case, the temperature of the refrigerant flowing through the piping 103 is adjusted by the area of the heat release portion 104 so as to be approximately 50° C. or less.

In the inside of the artificial satellite, a heat piping is often used as a heat transport device together with the electronic device cooling system 102 and the entire cooling system 2. Ammonia is used as refrigerant flowing through the heat piping. In the on-Earth environment, in general, water is often used as the refrigerant flowing through the heat piping.

In the first embodiment, description is made of a case of applying the configuration of the electronic device cooling system 102 using the pump as illustrated in FIG. 1, in which heat transport performance can be increased by using the pump than the heat piping.

As described above, when the refrigerant having high pressure such as ammonia flows through the piping 103, as the piping 103, a piping, which is made of metal, and is capable of resisting the high internal pressure of the refrigerant, is used. When a flexible tube which is made of a resin, and is liable to deform is used as the piping 103, the piping 103 may be damaged by the high internal pressure of the refrigerant. Further, the piping 103 made of a resin is deteriorated by radiation generated in the aerospace. Thus, in the aerospace, the flexible tube which is made of a resin, and is liable to deform cannot be used as the piping 103.

When ammonia is used as the refrigerant inside the piping 103 in the aerospace, a piping 103, which is made of metal, and is capable of resisting the high internal pressure of the refrigerant, is used. In this case, a joint portion in the piping 103 is required to be firmly joined by welding, brazing, or the like.

Figure 3:
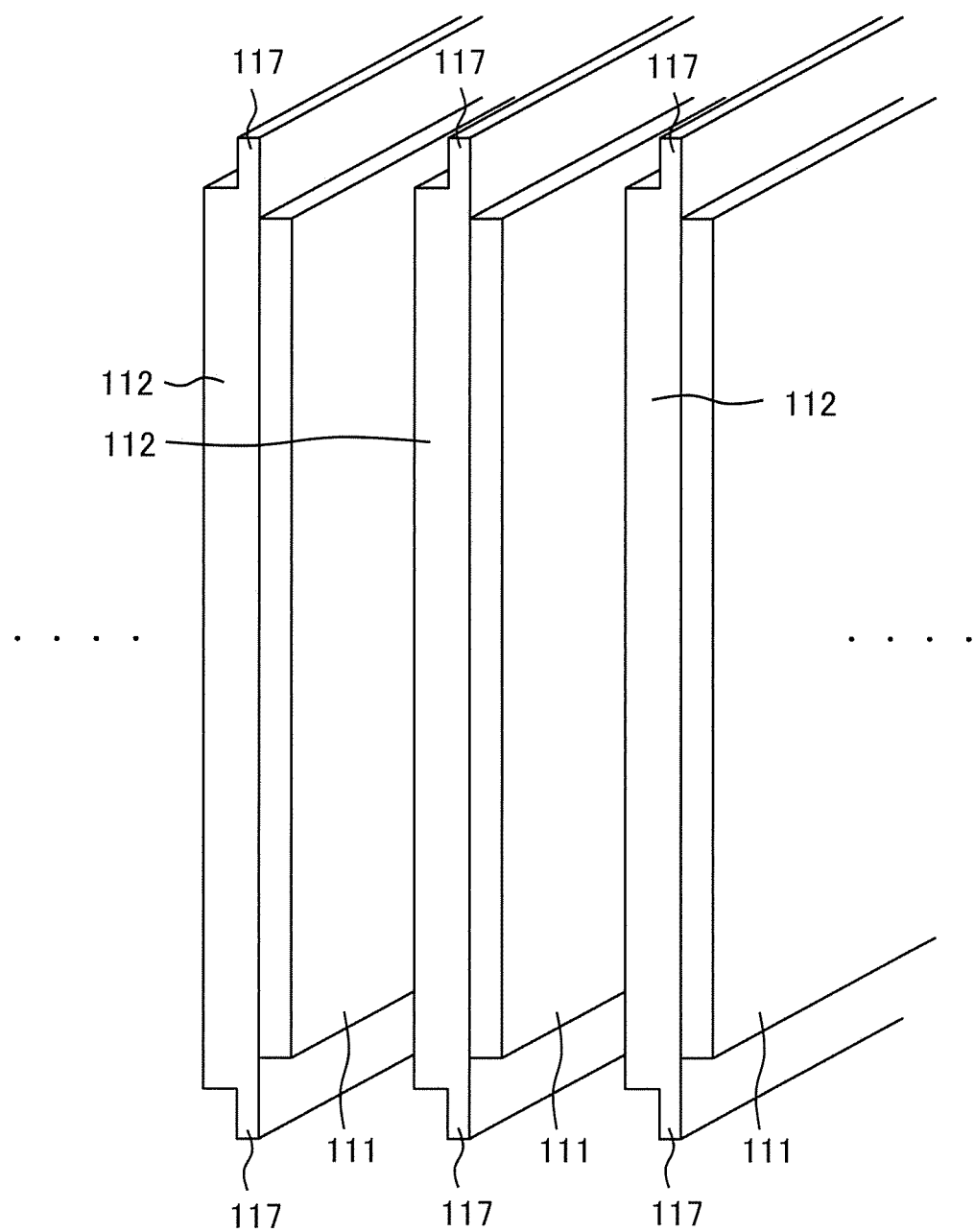
FIG. 3 is a perspective view for illustrating a main part of an electronic device unit when an electronic device cooling system is not installed.
Figure 4:
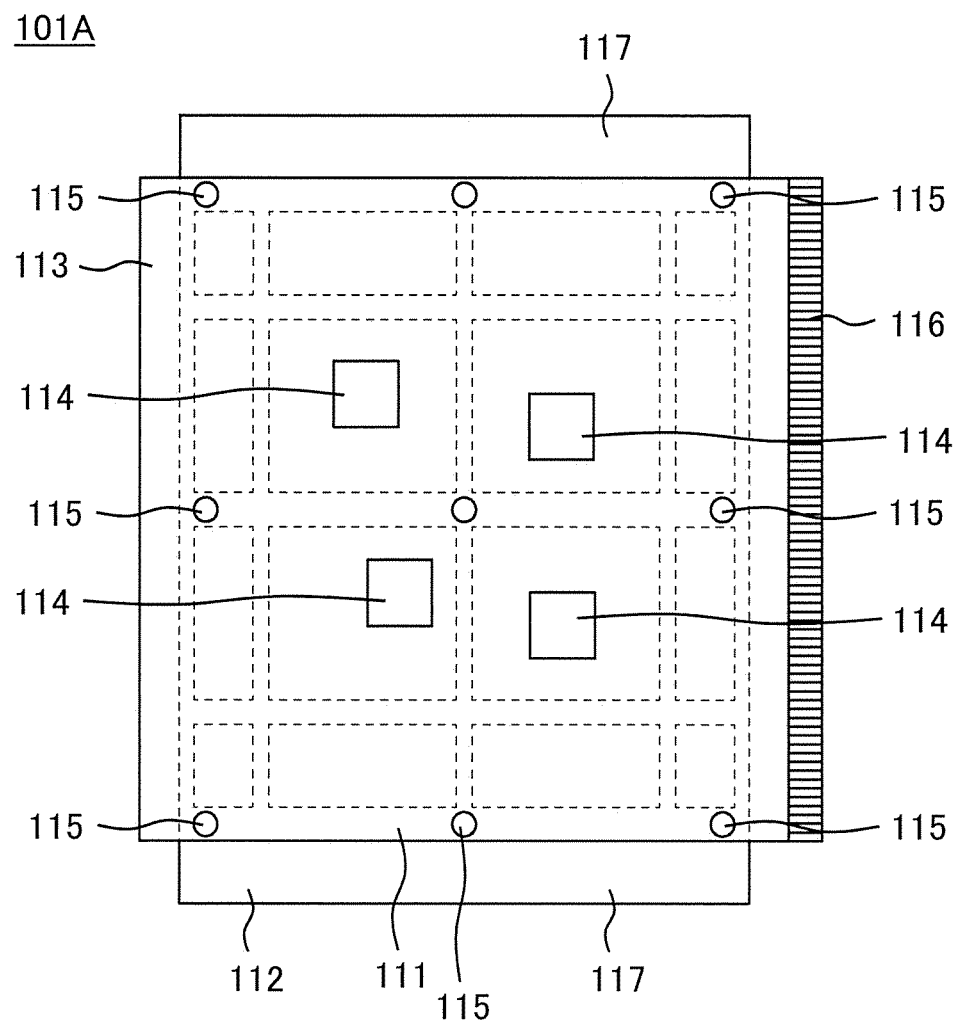
FIG. 4 is a side view for illustrating the main part of the electronic device unit of FIG. 3.

FIG. 3 is a perspective view for illustrating a main part of an electronic device unit when the electronic device cooling system is not installed. FIG. 4 is a side view for illustrating the main part of the electronic device unit of FIG. 3. In FIG. 3 and FIG. 4, an electronic device unit 101A which is a comparative example for explaining a comparison with the electronic device unit 101 is illustrated. The electronic device unit 101A is installed inside the artificial satellite 303.

The electronic device unit 101A includes a plurality of substrates 111, and a plurality of support members 112 configured to support the plurality of substrates 111, respectively. The substrate 111 includes a substrate main body 113, and a plurality of heat generating elements 114 provided on the substrate main body 113. The plurality of substrates 111 are arranged side by side in a plate thickness direction of the substrate main body 113. Thus, the plurality of support members 112 are arranged side by side in the plate thickness direction of the substrate main body 113. In this example, the plate thickness direction represents the plate thickness direction of the substrate main body 113. A region between the substrates 111 adjacent to each other is defined as an inter-substrate region. The heat generating elements 114 are arranged in the inter-substrate region.

Further, the electronic device unit 101A further includes a plurality of fasteners 115 configured to fix the substrate 111 to the support member 112. The fastener 115 includes an insert nut provided to the support member 112, and a screw to be inserted into the insert nut. The screws are inserted into the insert nuts, to thereby fix the substrate 111 to the support member 112.

An electric terminal 116 is provided to one end portion of the substrate 111 in a width direction. The electric terminal 116 is inserted into a connector (not shown) mounted to an outer frame (not shown). With this configuration, the substrate 111 is electrically connected the connector.

The heat generating elements 114 serve as main heat generating sources in the electronic device unit 101. In this example, four heat generating elements 114 are provided for one substrate main body 113. One heat generating element 114 may be provided for one substrate main body 113. Further, the plurality of substrate main bodies 113 may include a substrate 111 with no heat generating element 114. As the heat generating element 114, for example, a semiconductor element is given. Another semiconductor element (not shown) is provided on the substrate main body 113.

Support member fixing portions 117 are formed on both end portions of the support member 112 in a height direction. The support member fixing portions 117 are sandwiched by a retainer (not shown) mounted to the outer frame when the electric terminal 116 is inserted into the connector. The support member fixing portions 117 are sandwiched by the retainer, and the support member 112 is, thereby, fixed to the outer frame.

In a vacuum environment, heat is not transferred from the surface of the substrate 111 by convection flow. Thus, most of the heat generated in the heat generating element 114 is transferred to the outer frame via the substrate main body 113 and the support member 112 by heat conduction. The heat having been transferred to the outer frame is transferred to a wall (not shown) mounted to the outer frame. A transferring distance from the heat generating element 114 to the wall by the heat conduction is large. Thus, the heat resistance between the heat generating element 114 and the wall is large. As a result, a temperature difference between the heat generating element 114 and the wall becomes larger.

Figure 5:
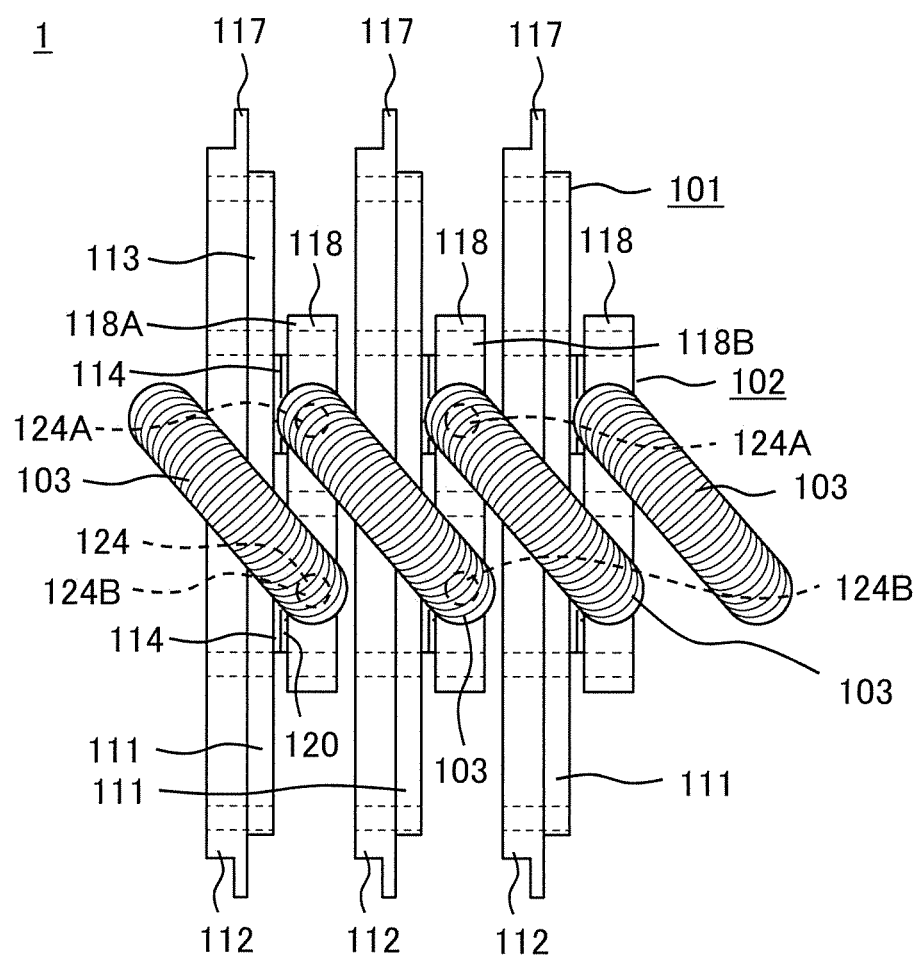
FIG. 5 is a front view for illustrating a main part of an electronic device of FIG. 1.
Figure 6:
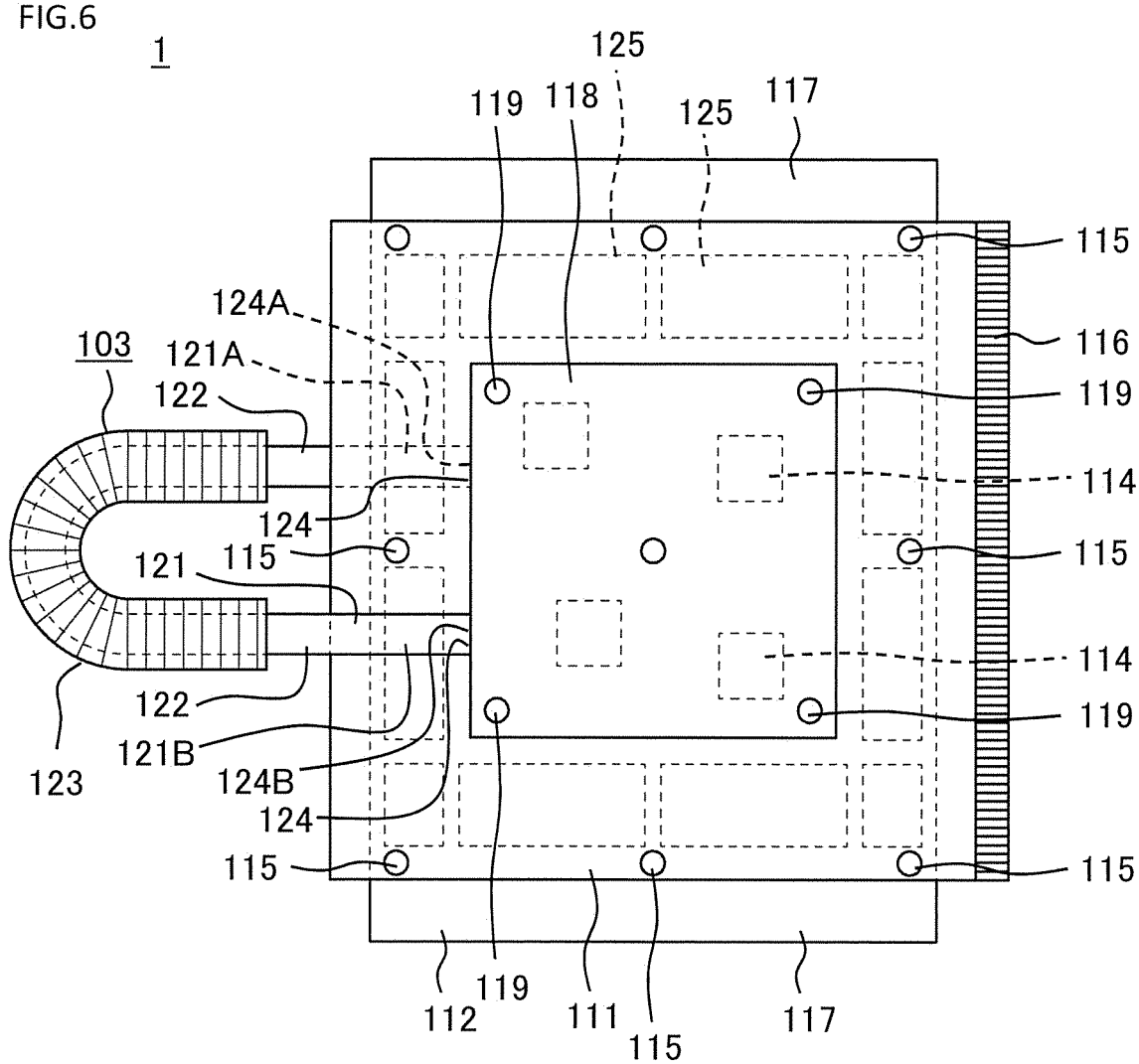
FIG. 6 is a side view for illustrating a main part of the electronic device of FIG. 5.

FIG. 5 is a front view for illustrating a main part of the electronic device 1 of FIG. 1. FIG. 6 is a side view for illustrating the main part of the electronic device 1 of FIG. 5. Similarly to the electronic device unit 110A, the electronic device unit 101 includes the plurality of substrates 111, the plurality of support members 112, and the plurality of fasteners 115. The electronic device cooling system 102 includes a plurality of coolers 118 each provided between the substrates 111 adjacent to each other, fasteners 119 configured to fix the cooler 118 to the support member 112, and heat transfer sheets 120. The heat generating elements 114 are arranged between the substrate main body 113 and the cooler 118. The substrate main body 113 and the heat generating elements 114 are arranged between the support member 112 and the cooler 118.

The refrigerant having high pressure flows through the cooler 118. The refrigerant flows through the cooler 118, and the heat generating elements 114 are, thereby, cooled.

The fastener 119 includes an insert nut provided to the support member 112, and a screw to be inserted into the insert nut. The screws are mounted to the insert nuts, and the cooler 118 is, thereby, mounted to the support member 112.

The piping 103 connects the pair of coolers 118 to each other. In this example, the piping 103 connecting the pair of coolers 118 to each other is described. The electronic device cooling system 102 includes a plurality of pipings 103 each connecting the pair of coolers 118 to each other.

The pump 105 is driven so that the refrigerant having high pressure circulates between the coolers 118 and the heat release portion 104 through the pipings 103. One of the pair of coolers 118 adjacent to each other is defined as a first cooler 118A, and the other is defined as a second cooler 118B. The piping 103 connects the first cooler 118A and the second cooler 118B to each other.

The piping 103 includes a pair of inner piping portions 121 arranged in the inter-substrate region, inner piping extending portions 122 extending from the inner piping portions 121 to an outside of the inter-substrate region, and an outer piping portion 123 arranged to be shifted from the inter-substrate region. A pair of ports 124 apart from each other along the substrate 111 are formed in a side surface of the cooler 118. One of the pair of ports 124 is defined as a first port 124A, and the other is defined as a second port 124B.

One of the pair of inner piping portions 121 is defined as a first inner piping portion 121A, and the other is defined as a second inner piping portion 121B. One end portion of the first inner piping portion 121A is connected to the first port 124A of the first cooler 118A. The other end portion of the first inner piping portion 121A is connected to one end portion of the inner piping extending portion 122. One end portion of the second inner piping portion 121B is connected to the second port 124B of the second cooler 118B. The other end portion of the second inner piping portion 121B is connected to one end portion of the inner piping extending portion 122. The other end portion of the inner piping extending portion 122 is connected to the outer piping portion 123 at a position shifted from the inter-substrate region. The outer piping portion 123 has a U-shape. The outer piping portion 123 includes a movable piping portion that is deformable.

An outer diameter dimension of the movable piping portion included in the outer piping portion 123 is larger than a dimension of the cooler 118 in the plate thickness direction of the substrate main body 113.

The piping 103 is made of metal in order to secure the pressure of the refrigerant. After the substrate 111 and the cooler 118 are mounted to each of the support members 112, the entire electronic device 1 or the outer frame (not shown) is moved to insert the electric terminals 116 to the connector, to thereby assemble the electronic device 1. The piping 103 is deformable due to the movable piping portion included in the outer piping portion 123. With this configuration, when the electric terminals 116 are to be inserted into the connector, an error in position of the substrates 111, on which the pair of coolers 118 connected by the piping 103 are mounted, is allowed to some extent. Further, the outer piping portion 123 is formed to have a sufficient length, and hence, when the substrate 111 and the cooler 118 are to be mounted to the support member 112, an interval between the support members 112 adjacent to each other can be increased locally. With this configuration, ease of assembling of the electronic device 1 can be improved.

The cooler 118 is arranged so as to be overlapped on the heat generating elements 114 via the heat transfer sheet 120. In other words, the heat transfer sheet 120 is provided between the cooler 118 and the heat generating elements 114. With this configuration, the heat resistance is reduced as compared to a case in which heat is transferred from the heat generating elements 114 to the substrate 111 and the support member 112 by heat conduction. In other words, the heat resistance between the heat generating elements 114 and the cooler 118 can be reduced. Thus, cooling capacity with respect to the heat generating elements 114 can be improved.

Further, the outer diameter dimension of the movable piping portion included in the outer piping portion 123 is larger than an outer diameter dimension of each of the inner piping portions 121. When the outer diameter dimension of the movable piping portion included in the outer piping portion 123 is set equal to the outer diameter dimension of each of the inner piping portions 121, an inner diameter dimension of the movable piping portion included in the outer piping portion 123 is smaller than an inner diameter dimension of each of the inner piping portions 121. In this case, pressure loss when the refrigerant flows through the movable piping portion included in the outer piping portion 123 is increased. The outer diameter dimension of the movable piping portion included in the outer piping portion 123 is larger than the outer diameter dimension of each of the inner piping portions 121, thereby being capable of reducing the pressure loss when the refrigerant flows through the movable piping portion included in the outer piping portion 123.

In this example, the inner diameter dimension of the movable piping portion included in the outer piping portion 123 is equal to the inner diameter dimension of each of the inner piping portions 121. The inner diameter dimension of the movable piping portion included in the outer piping portion 123 may not be equal to the inner diameter dimension of each of the inner piping portions 121. The dimensions of the outer diameter, the inner diameter, and the length of the movable piping portion included in the outer piping portion 123 are determined by an internal pressure applied to the movable piping portion included in the outer piping portion 123, an amount of deformation that occurs in the movable piping portion included in the outer piping portion 123, or the like. As the amount of deformation that occurs in the movable piping portion included in the outer piping portion 123, there are given, for example, a bending amount, an extension amount, and a contraction amount.

The plurality of heat generating elements 114 are provided on the substrate main body 113. One cooler 118 is configured to cool the plurality of heat generating elements 114 on one substrate main body 113. In order to cool the plurality of heat generating elements 114 on one substrate main body 113, there may be employed a configuration in which the plurality of coolers 118 are installed. However, the size and weight of the electronic device 1 can be reduced by employing a configuration in which one cooler 118 cools the plurality of heat generating elements 114 on one substrate main body 113.

The cooler 118 and the support member 112 are fixed to each other using the fasteners 119. With this configuration, the rigidity of the substrate 111 can be improved. Thus, occurrence of warpage of the substrate 111 can be suppressed. The support member 112 has a plurality of opening portions 125. With this configuration, the weight of the support member 112 can be reduced.

In FIG. 6, the configuration in which only the heat generating elements 114 are provided on the substrate main body 113 is illustrated. However, an element other than the heat generating elements 114 may be provided on the substrate main body 113. As the element other than the heat generating elements 114, for example, a semiconductor element having a small heat generating amount is given. The cooler 118 is not required to be mounted to the semiconductor element having a small heat generating amount. In this case, heat generated in the semiconductor element having a small heat generating amount is released to the outside by heat conduction of the substrate main body 113 and the support member 112.

As the refrigerant flowing through the electronic device cooling system 102, there are given a single-phase flow to be used by only a single phase of liquid, and a two-phase flow in which liquid is boiled by the cooler 118 so that part of the liquid turns to gas, and the gas is condensed by the heat release portion 104 to be returned to the liquid. In this example, the electronic device cooling system 102 using the two-phase flow, in which the pressure inside the piping 103 becomes higher, is described. The refrigerant circulating through the piping 103 receives heat from the heat generating elements 114 in the cooler 118. With this configuration, part of the refrigerant turns to vapor. Thus, at least part of the refrigerant inside the cooler 118 is in a two-phase gas-liquid state. The refrigerant having turned to the two-phase gas-liquid state in which the gas and the liquid are mixed with each other is sent to the heat release portion 104.

In the heat release portion 104, the refrigerant is cooled and the vapor is condensed to return to the liquid. Thus, the refrigerant having passed through the heat release portion 104 flows into the pump 105 as a single-phase flow of only the liquid. The refrigerant having been increased in pressure in the pump 105 is heated by the heater 108 until reaching a temperature at which boiling is started. The refrigerant heated by the heater 108 is sent to the cooler 118 again.

When heat transport is performed by such a two-phase gas-liquid flow, the entire inside of the piping 103 is not filled with the refrigerant, but after the inside of the piping 103 is evacuated, the refrigerant is sealed in a part of the piping 103 so that other gas is hardly mixed. Thus, the gas region is filled with refrigerant vapor, and, in particular, vapor for pressure control can be stored inside the accumulator 106.

In the two-phase gas-liquid flow using boiling and condensation of the refrigerant, latent heat generated when the refrigerant turns form the liquid to the gas is used for cooling. Thus, unlike the single-phase flow, the temperature of the refrigerant does not increase on a downstream side. Further, with use of the latent heat, an increase in the temperature of the electronic device 1 due to an increase in the temperature of the sensible heat can be suppressed with a small amount of refrigerant without circulating a large amount of refrigerant, thereby being capable of reducing the weight of the electronic device cooling system 102.

The cooler 118 cools the heat generating elements 114 with use of the latent heat generated when the refrigerant changes from the liquid to the gas. The amount of the refrigerant can be reduced, thereby being capable of reducing the sizes of the piping 103 and the pump 105. As a result, the weights of the piping 103 and the pump 105 can be reduced.

However, in order to utilize the boiling phenomenon, it is required to increase the pressure of the medium up to the saturated vapor pressure. With this configuration, the internal pressure that acts on the piping 103 is higher than that of the case of the single-phase flow. Thus, the piping 103 requires higher pressure resistance than that of the case of the single-phase flow.

For example, when the temperature of ammonia increases up to a temperature of 50° C. at the maximum, a saturated vapor pressure of ammonia at 50° C. is about 20 atm. In consideration of likelihood, the piping 103 is required to have a property of resisting an internal pressure equal to or larger than about 20 times the normal atmospheric pressure.

In the first embodiment, the outer diameter dimension of the movable piping portion included in the outer piping portion 123 is large, and hence the outer piping portion 123 is arranged so to be shifted from the inter-substrate region. With this configuration, a distance between the substrates 111 adjacent to each other can be reduced. Thus, the size and weight of the electronic device 1 can be reduced.

When water is used as the refrigerant, a saturated vapor pressure at 50° C. is 0.12 atm. The saturated vapor pressure of water is smaller than 1 atm which is the atmospheric pressure. Thus, in Earth environment, it is only required that the piping 103 resist an external pressure of about 1 atm which acts on the piping 103 from the outside to the inner side. The pressure resistance of the piping 103 in this case is smaller by one or more digits than the pressure resistance of the piping 103 required in ammonia which is refrigerant having high pressure, and has a required direction different from that in ammonia.

In the first embodiment, at least two or more coolers 118 are connected in series to each other. When two or more coolers 118 are connected in parallel to each other, in general, a common header is provided, and the refrigerant is distributed to the respective coolers 118 by a distribution tube. When the refrigerant is distributed, a valve for adjusting the flow rate of the refrigerant is provided to each distribution tube.

Even when two or more coolers 118 are connected in parallel to each other, in order to absorb tolerance of each member at the time of assembling of the electronic device 1, relax deformation of the substrate 111 after mounting, and to improve ease of assembling, it is required to arrange a movable piping portion between the common header and each of the coolers 118.

When the plurality of coolers 118 are connected in series to each other, the flow passage sectional area of the refrigerant is smaller than that of the case in which the plurality of coolers 118 are connected in parallel to each other. For example, when thirty substrates 111 are connected in parallel to each other, the number of the pipings 103 each connected from the common header to one cooler 118 is thirty. On the other hand, when the thirty substrates 111 are connected in series to each other, all the coolers 118 are connected to each other by one piping 103. Thus, when the inner diameters of the pipings 103 are equal to each other, the flow passage sectional area of the refrigerant in the case in which the plurality of coolers 118 are connected in series to each other is 1/30 of the flow passage sectional area of the refrigerant in the case in which the plurality of coolers 118 are connected in parallel to each other. With this configuration, the flow rate of the refrigerant passing through the piping 103 is increased, and pressure loss when the refrigerant passes through the piping 103 is increased. However, in a case of the electronic device 1 using latent heat, heat transport can be carried out through change of part of the refrigerant of liquid to gas. Thus, a circulation flow rate required in the refrigerant passing through the piping 103 can be reduced as compared to the case of the single-phase flow. With this configuration, an increase in the pressure loss when the refrigerant passes through the piping 103 can be suppressed. Further, the refrigerant is circulated through the piping 103 by using the pump 105, and hence the pressure loss when the refrigerant passes through the piping 103 is not a large problem.

Further, in the case in which the plurality of coolers 118 are connected in series to each other, the refrigerant flows through all the coolers 118. With this configuration, there is no problem for distributing the refrigerant to the plurality of coolers 118. On the other hand, in the case in which the plurality of coolers 118 are connected in parallel to each other, a valve for properly distributing the refrigerant from the common header to the respective coolers 118 is required.

In particular, when heat transport is carried out using a two-phase gas-liquid flow of the refrigerant, the flow of the refrigerant changes in accordance with the heat generating amount, the flow rate, and the piping diameter, for example, to a slug flow in which refrigerant of gas and refrigerant of liquid alternately pass through the piping 103, or a circular flow in which refrigerant of liquid passes near the side surface of the piping 103, and refrigerant of gas passes through a radial center portion of the piping 103. The flow of the refrigerant changes in accordance with a change in the heat generating amount or the flow rate, and, as a result, the pressure loss is changed, and a distribution amount of the refrigerant is changed. Thus, it is required to control the flow rate and the temperature using the valve and the heater by always monitoring the state so as to prevent a condition in which part of the refrigerant does not flow to the cooler 118 or a condition in which the flow rate of the refrigerant is significantly reduced.

Thus, in the case in which the plurality of coolers 118 are connected in series to each other, control is simplified, and, further, the number of mechanisms configured to adjust the flow rate and the temperature of the refrigerant such as the valve and the heater is reduced, thereby being capable of reducing the size and weight of the electronic device 1.

The outer piping portion 123 includes the movable piping portion. Thus, the outer piping portion 123 requires a large installation space as compared to a piping not including the movable piping portion. The outer piping portion 123 including the movable piping portion is arranged to be shifted from the inter-substrate region, to thereby reduce the distance between the substrates.

The movable piping portion included in the outer piping portion 123 is formed to have a bellows structure, a corrugated structure, or the like so that the movable piping portion included in the outer piping portion 123 is deformable. Thus, there is a constraint on the curvature at which the outer piping portion 123 can be deformed. When the distance between the substrates 111 adjacent to each other is small, the curvature allowed in the outer piping portion 123 may not be sufficient. Thus, the curvature allowed in the outer piping portion 123 may become a bottleneck when the distance between the substrates 111 adjacent to each other is to be reduced.

In order to reduce the distance between the substrates 111 adjacent to each other, the dimension of the cooler 118 in the plate thickness direction of the substrate main body 113 is set to small. The dimension of the cooler 118 in the plate thickness direction of the substrate main body 113 is substantially equal to the outer diameter dimension of each of the inner piping portions 121. The cooler 118 is brought into contact with the heat generating elements 114 through intermediation of the heat transfer sheet 120 in the plate thickness direction. The dimension of the cooler 118 in the plate thickness direction is smaller than a dimension of the cooler 118 in a direction perpendicular to the plate thickness direction. In other words, each of the dimension of the cooler 118 in the width direction and the dimension of the cooler 118 in the height direction is larger than the dimension of the cooler 118 in the plate thickness direction.

The piping 103 connects the first port 124A of the first cooler 118A and the second port 124B of the second cooler 118B to each other. A distance between the first port 124A of the first cooler 118A and the second port 124B of the second cooler 118B is larger than a distance between the first port 124A of the first cooler 118A and the first port 124A of the second cooler 118B. Thus, the curvature of the outer piping portion 123 can be reduced in the case in which the first port 124A of the first cooler 118A and the second port 124B of the second cooler 118B are connected to each other as compared to the case in which the first port 124A of the first cooler 118A and the first port 124A of the second cooler 118B are connected to each other. Thus, the curvature allowed in the outer piping portion 123 is suppressed from becoming a bottleneck when the distance between the substrates 111 adjacent to each other is reduced. As a result, the ease of assembling of the electronic device 1 can be improved, and, further, the size and weight of the electronic device 1 can be reduced.

As described above, in the electronic device 1 according to the first embodiment of this invention, the pipings 103 made of metal are connected to each of the coolers 118. With this configuration, the pressure resistance of the piping 103 against the refrigerant can be improved. Further, the piping 103 includes the inner piping portions 121, the inner piping extending portions 122, and the outer piping portion 123. The outer piping portion 123 is arranged to be shifted from the inter-substrate region. The inner piping portions 121 are arranged in the inter-substrate region. The outer piping portion 123 having a large outer diameter dimension is arranged to be shifted from the inter-substrate region, and the inner piping portions 121 each having a small outer diameter dimension are arranged in the inter-substrate region, thereby being capable of reducing the distance between the substrates 111 adjacent to each other. Thus, the size and weight of the electronic device 1 can be reduced. Further, the outer piping portion 123 includes the movable piping portion that is deformable. With this configuration, the ease of assembling of the electronic device 1 can be improved.

Further, the cooler 118 is configured to cool the heat generating element 114 with use of the latent heat generated when the refrigerant changes from liquid to gas. With this configuration, the size and weight of the electronic device 1 can be reduced.

Further, the piping 103 connects the pair of coolers 118 to each other. With this configuration, the refrigerant at the same flow rate can be caused to flow to each of the plurality of pipings 103. Further, two or more coolers 118 are connected in series to each other. With this configuration, the common header can be reduced. Thus, the size and weight of the electronic device 1 can be reduced.

Further, the piping 103 connects the first port 124A of the first cooler 118A and the second port 124B of the second cooler 118B to each other. With this configuration, the distance between the substrates 111 adjacent to each other can be reduced.

In the first embodiment, description has been made of the electronic device 1 used inside the artificial satellite. However, application of the present invention is not limited thereto. For example, the electronic device 1 may be used on Earth. In this case, as the electronic device 1, for example, a server blade used in a large-sized supercomputer is given.

In the electronic device 1 on Earth, in general, heat generated in the heat generating element 114 is released mainly by transfer of heat to fluid flowing between the substrates 111 adjacent to each other. When the heat generating amount of the heat generating element 114 is small, heat transport is carried out by self-cooling circulation. When the heat generating amount of the heat generating element 114 is large, heat transport is carried out by air blowing by a fan. In the first embodiment, the cooler 118 is overlapped on the heat generating elements 114. With this configuration, the capacity for cooling the heat generating elements 114 can be greatly improved.

Second Embodiment

Figure 7:
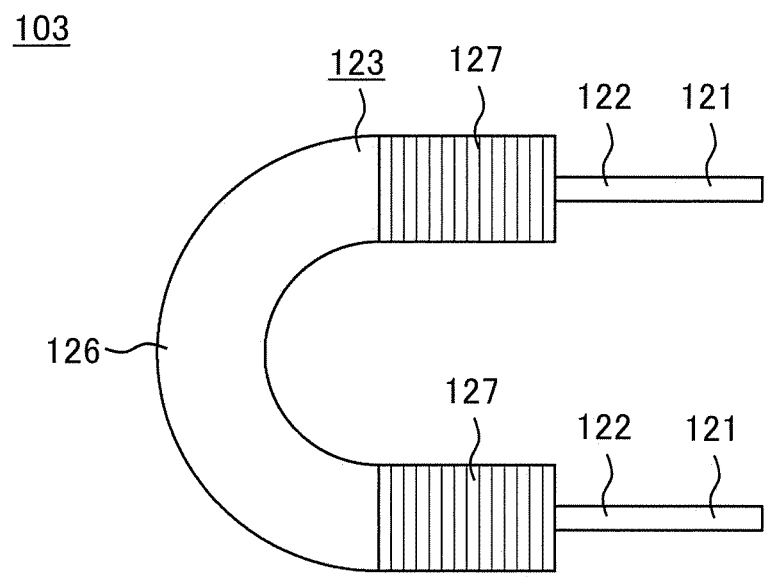
FIG. 7 is a side view for illustrating a piping in an electronic device according to a second embodiment of this invention.

FIG. 7 is a side view for illustrating a piping in an electronic device according to a second embodiment of this invention. The piping 103 includes the pair of inner piping portions 121, the pair of inner piping extending portions 122 connected to the pair of inner piping portions 121, and a pair of outer piping portions 123 connected to the pair of inner piping extending portions 122. The inner piping portions 121 and the inner piping extending portions 122 are each formed so as to extend in a linear shape. The outer piping portion 123 includes a curved piping portion 126 formed in a U-shape, and a pair of movable piping portions 127 each connecting the inner piping extending portion 122 and the curved piping portion 126 to each other. The curved piping portion 126 is arranged so as to straddle a side surface of the substrate 111. The movable piping portions 127 are each arranged so as to extend in a linear shape on an extension line of the inner piping portion 121 and the inner piping extending portion 122 when an external force is not applied.

In general, the piping 103 having a bellows structure or a corrugated shape that is deformable is manufactured with a state in which the piping 103 is arranged to extend in a linear shape as a reference. Thus, when the outer piping portion 123 is installed in a curved state as in the first embodiment, likelihood for the outer piping portion 123 to be further curved and deformed is reduced. Further, the curvature at which the movable piping portion of the outer piping portion 123 can be curved is smaller than a curvature in a general piping formed to be curved. Thus, the curvature at which the outer piping portion 123 can be curved can be suppressed from becoming a bottleneck when the distance between the substrates 111 adjacent to each other is reduced. In the first embodiment, the inner diameter dimension of the movable piping portion included in the outer piping portion 123 is equal to the inner diameter dimension of each of the inner piping portions 121. Further, in the first embodiment, the movable piping portion included in the outer piping portion 123 is divided into portions each having a linear shape and a portion having a curved shape.

In the second embodiment, the outer piping portion 123 includes the movable piping portions 127 each having a linear shape, and the curved piping portion 126 having a curved shape. The curvature of the curved piping portion 126 can be set larger than the curvature of the movable piping portion included in the curved outer piping portion 123 in the first embodiment. With this configuration, the second embodiment can be adapted to the reduction in the distance between the substrates 111 adjacent to each other to a high degree. Thus, the size and weight of the electronic device 1 can be reduced.

The outer diameter dimension of the curved piping portion 126 is equal to the outer diameter dimension of the outer piping portion 123 in the first embodiment. Thus, the outer diameter dimension of the curved piping portion 126 is larger than the outer diameter dimension of each of the inner piping portions 121.

Figure 8:
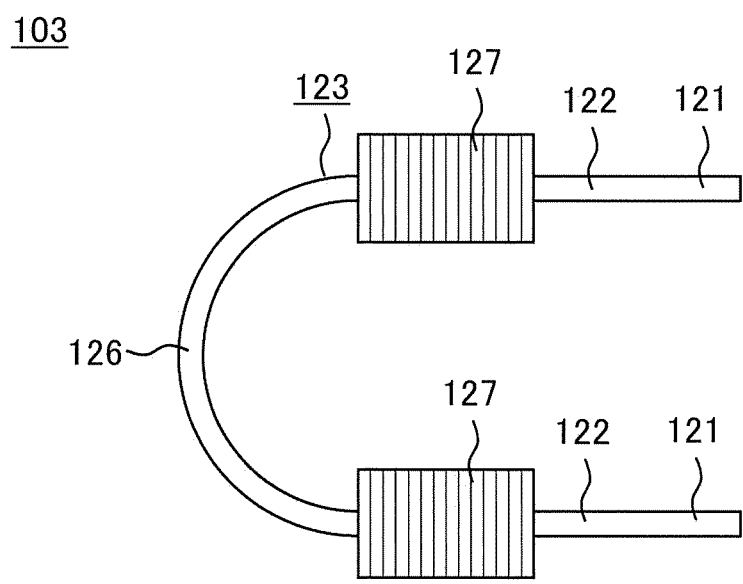
FIG. 8 is a side view for illustrating a modification example of the piping of FIG. 7.

FIG. 8 is a side view for illustrating a modification example of the piping 103 of FIG. 7. The outer diameter dimension of the curved piping portion 126 may be equal to the outer diameter dimension of each of the inner piping portions 121. In this case, the size and weight of the electronic device 1 can be further reduced.

Figure 9:
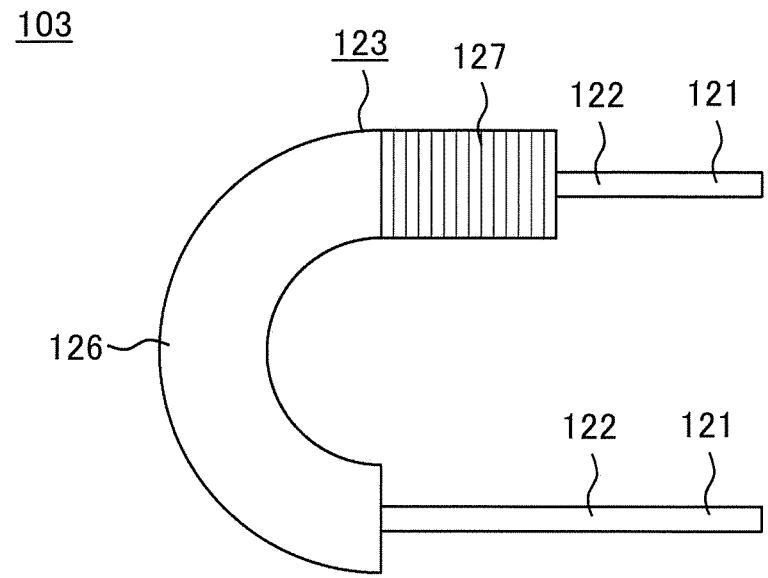
FIG. 9 is a side view for illustrating a modification example of the piping of FIG. 7.

FIG. 9 is a side view for illustrating a modification example of the piping 103 of FIG. 7. The outer piping portion 123 may have one movable piping portion 127 instead of the pair of movable piping portions 127. In this case, one inner piping extending portion 122 of the pair of inner piping extending portions 122 is connected to the movable piping portion 127, and the other inner piping extending portion 122 is connected to the curved piping portion 126. When the movable piping portion 127 that is deformable is arranged in at least one portion in the outer piping portion 123, the ease of assembling of the electronic device 1 can be improved, and the size and weight of the electronic device 1 can be reduced. However, the deformation amount of the outer piping portion 123 in this case becomes smaller.

Figure 10:
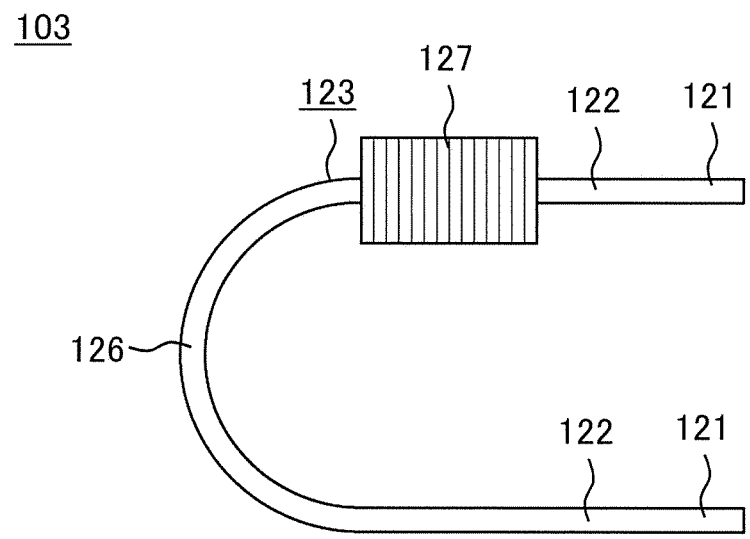
FIG. 10 is a view for illustrating a modification example of the piping of FIG. 9.

FIG. 10 is a view for illustrating a modification example of the piping 103 of FIG. 9. Similarly to FIG. 8, the outer diameter dimension of the curved piping portion 126 may be equal to the outer diameter dimension of each of the inner piping portions 121. In this case, the size and weight of the electronic device 1 can be further reduced.

In the second embodiment, the curved piping portion 126 is a piping that is not deformable. Thus, the curvature of the curved piping portion 126 can be increased, and, further, the curved piping portion 126 can easily be made thinner.

Further, the movable piping portion 127 that is deformable is formed to extend in a linear shape when an external force is not applied. Thus, likelihood of the deformation amount of the movable piping portion 127 can be increased. As a result, the required length of the piping 103 can be reduced. With this configuration, the size and weight of the electronic device 1 can be reduced.

Figure 11:
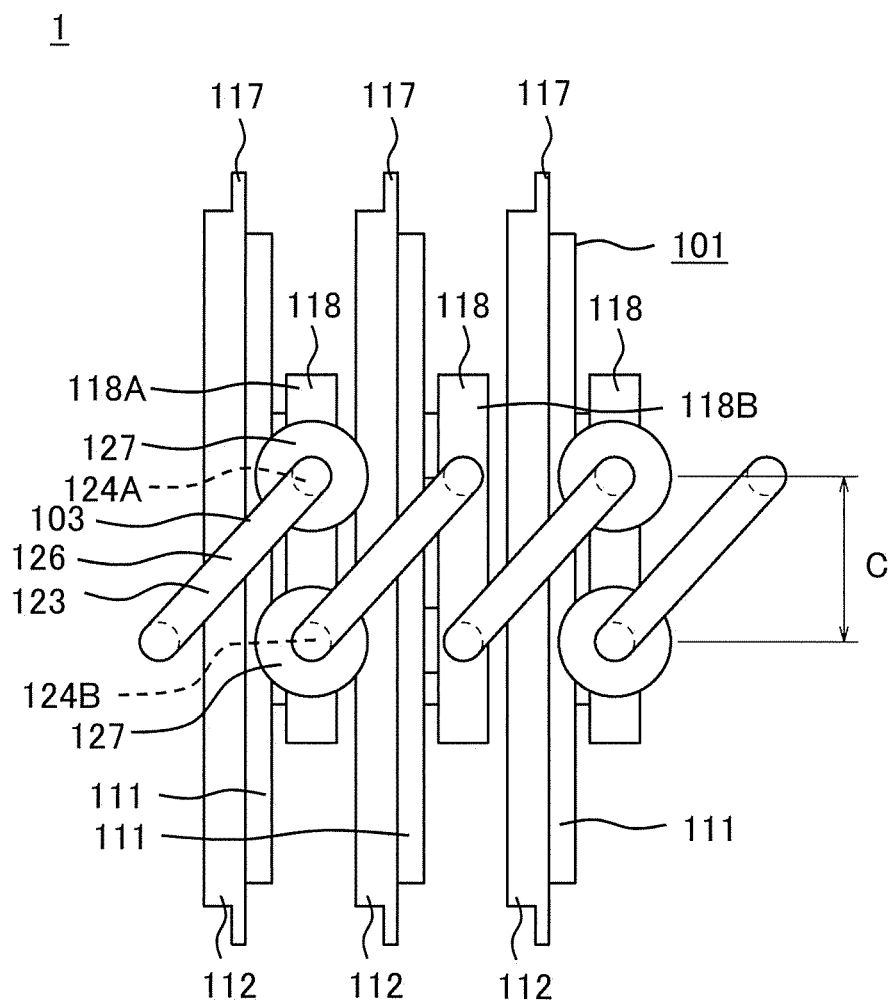
FIG. 11 is a front view for illustrating a main part of the electronic device when the piping of FIG. 10 connects a pair of coolers to each other.

FIG. 11 is a front view for illustrating a main part of the electronic device 1 when the pipings 103 of FIG. 10 each connect the pair of coolers 118 to each other. In FIG. 11, the movable piping portions 127 are arranged so as to be overlapped on the first port 124A and the second port 124B of the first cooler 118A when viewed in the direction perpendicular to the side surface of the cooler 118. Thus, the movable piping portions 127 are not overlapped on the first port 124A and the second port 124B of the second cooler 118B. In this case, the shortest distance between the pair of movable piping portions 127 adjacent to each other is C.

Figure 12:
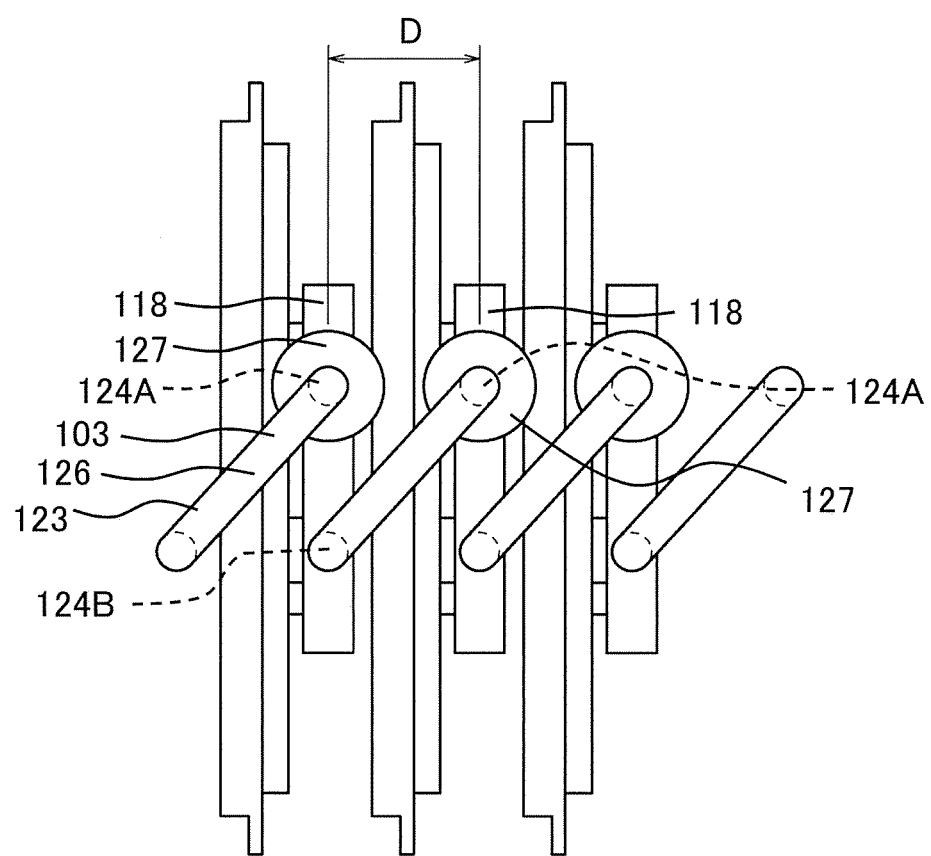
FIG. 12 is a front view for illustrating a main part of the electronic device when the piping of FIG. 10 connects the pair of coolers to each other.

FIG. 12 is a front view for illustrating a main part of the electronic device 1 when the pipings 103 of FIG. 10 each connect the pair of coolers 118 to each other. In FIG. 12, the movable piping portions 127 are arranged so as to be overlapped on the first port 124A of each of the coolers 118 when viewed in the direction perpendicular to the side surface of the cooler 118. In this case, the shortest distance between the pair of movable piping portions 127 adjacent to each other is D.

The dimension of the cooler 118 in the plate thickness direction is smaller. Further, the dimension of the cooler 118 in the width direction and the dimension of the cooler 118 in the height direction are larger than the dimension of the cooler 118 in the plate thickness direction. Thus, a relationship of C>D is satisfied.

As illustrated in FIG. 11, the movable piping portions 127 are arranged so as to be overlapped on only the first cooler 118A of the pair of coolers 118, thereby being capable of suppressing the distance between the pair of movable piping portions 127 adjacent to each other from becoming a bottleneck depending on the positions at which the movable piping portions 127 are arranged. With this configuration, the ease of assembling of the electronic device 1 is improved, and the size and weight of the electronic device 1 can be further reduced.

As described above, in the electronic device 1 according to the second embodiment of this invention, the outer piping portion 123 includes the curved piping portion 126, and the movable piping portions 127 that are deformable. With this configuration, the curvature of the curved portion of the outer piping portion 123 can be increased, and, further, the outer diameter dimension of the curved portion of the outer piping portion 123 can be reduced. Further, the movable piping portions 127 each have a linear shape when an external force is not applied. With this configuration, the likelihood of the deformation amount of the movable piping portion 127 can be increased. Thus, the length of the curved piping portion 126 can be shortened. Accordingly, the ease of assembling of the electronic device 1 can be improved, and the size and weight of the electronic device 1 can be reduced.

Further, the movable piping portion 127 is arranged so as to be overlapped on only the first cooler 118A when viewed in the direction perpendicular to the side surface of the cooler 118. With this configuration, a distance between the movable piping portions 127 adjacent to each other can be reduced.

Third Embodiment

Figure 13:
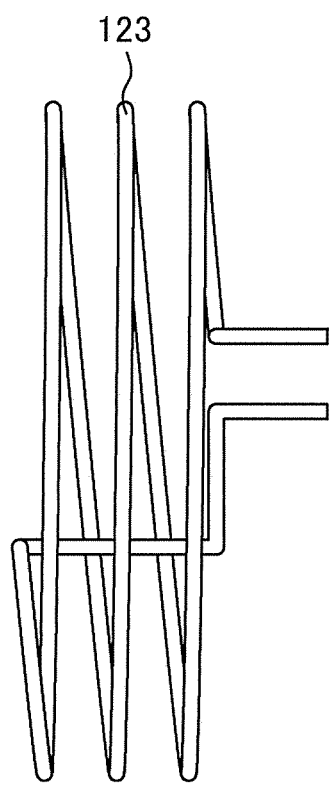
FIG. 13 is a side view for illustrating a piping in an electronic device according to a third embodiment of this invention.

FIG. 13 is a side view for illustrating a piping in an electronic device according to a third embodiment of this invention. The outer piping portion 123 including the movable piping portion that is deformable has a coil shape. Other configurations are the same as those of the first embodiment or the second embodiment.

In the first embodiment, as the outer piping portion 123, the flexible piping formed to have a structure such as a bellows structure or a corrugated structure is used. In the structures such as the bellows structure and the corrugated structure, the outer diameter dimension of the outer piping portion 123 becomes larger.

In the third embodiment, the outer piping portion 123 has a coil shape. With this configuration, as the outer piping portion 123, it is not required to use a flexible piping formed to have a bellows structure or a structure having a corrugated shape. Even in this case, too, it is possible to absorb tolerance at the time of assembling of the electronic device 1, relax deformation of the substrate 111 after mounting, and improve the ease of assembling of the electronic device 1. Further, the outer diameter dimension of the outer piping portion 123 can be reduced.

The outer piping portion 123 has a coil shape. Thus, as compared to the flexible piping formed to have a structure such as a bellows structure or a corrugated structure, a length of a flow passage for the refrigerant flowing through the outer piping portion 123 is increased. The weight of the outer piping portion 123 changes in accordance with the number of turns in the outer piping portion 123.

When the outer diameter dimension of the outer piping portion 123 is large, it is difficult to change the shape of the outer piping portion 123 into the coil shape. Thus, it is preferred that the outer diameter dimension of the outer piping portion 123 be smaller.

The outer diameter dimension of the outer piping portion 123 is equal to the outer diameter dimension of each of the inner piping portions 121. In the first embodiment and the second embodiment, the movable piping portion included in the outer piping portion 123 is connected to the inner piping extending portions 122 by welding. On the other hand, in the third embodiment, the outer piping portion 123 having a coil shape and the inner piping extending portions 122 are formed simultaneously in a state of being connected to each other. Thus, welding for connecting the outer piping portion 123 and the inner piping extending portions 122 to each other is omitted, and the electronic device 1 can be reduced in cost. Further, the outer piping portion 123 has no bellows structure or corrugated structure, thereby being capable of reducing the weight of the outer piping portion 123.

The outer diameter of the entire outer piping portion 123 formed to have a coil shape is larger than the outer diameter dimension of the outer piping portion 123. The outer piping portion 123 is arranged to be shifted from the inter-substrate region. With this configuration, the ease of assembling of the electronic device 1 can be improved, and the size and weight of the electronic device can be reduced.

As described above, in the electronic device 1 according to the third embodiment of this invention, the outer piping portion 123 has a coil shape. With this configuration, the size and weight of the electronic device 1 can be reduced.

Fourth Embodiment

Figure 14:
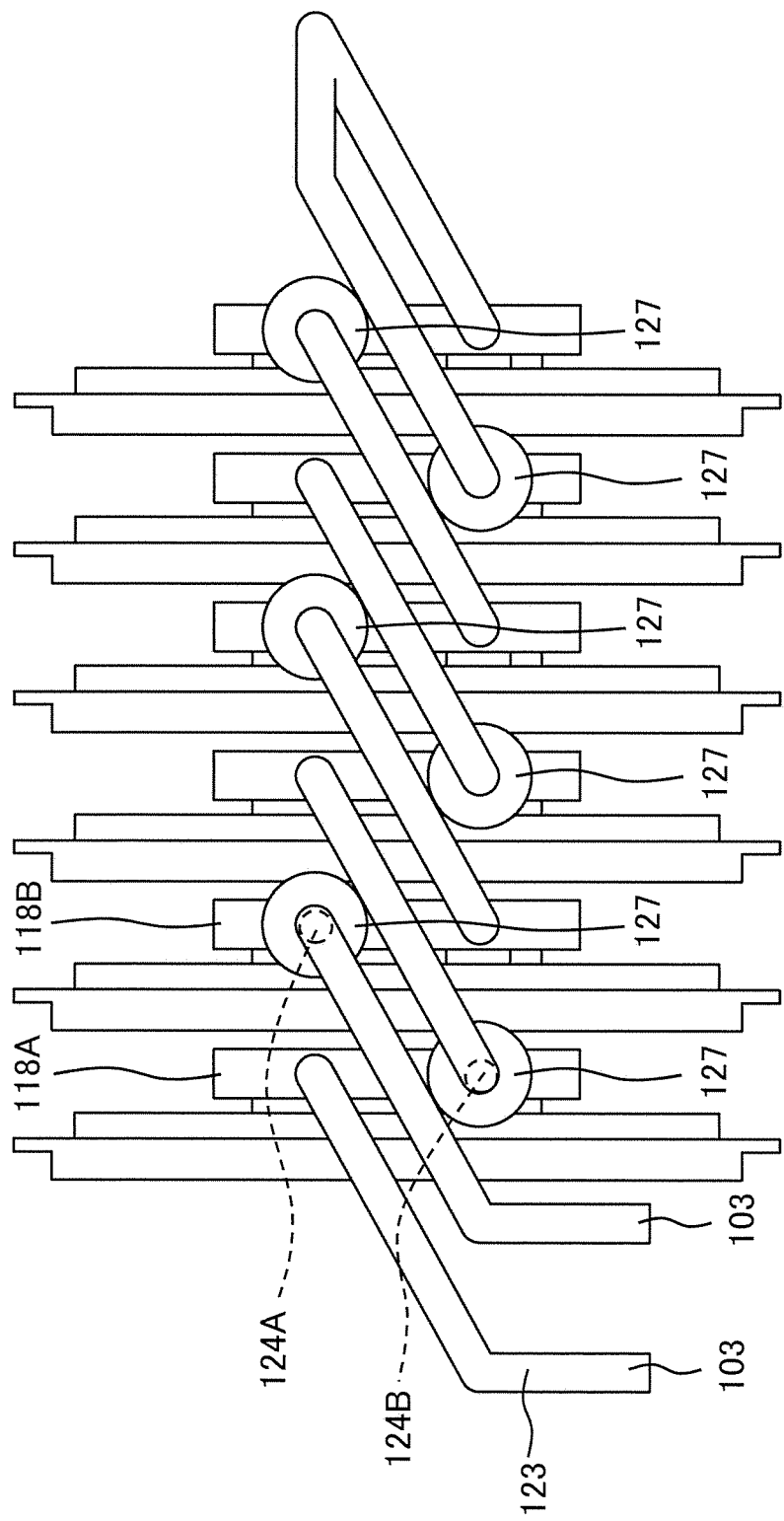
FIG. 14 is a front view for illustrating a main part of an electronic device according to a fourth embodiment of this invention.

FIG. 14 is a front view for illustrating a main part of an electronic device according to a fourth embodiment of this invention. The piping 103 connects a pair of coolers 118, which are apart from each other across two coolers 118 among the plurality of coolers 118, to each other. In other words, the pair of coolers 118 connected to each other by the cooler 118 are not adjacent to each other.

When viewed in the direction perpendicular to the side surface of the cooler 118, the movable piping portions 127 are overlapped on the second port 124B of the first cooler 118A and the first port 124A of the second cooler 118B of the pair of coolers 118 adjacent to each other. Other configurations are the same as those of any one of the first embodiment to the third embodiment.

As described above, in the electronic device 1 according to the fourth embodiment of this invention, the piping 103 connects the pair of coolers 118, which are apart from each other across two coolers 118 among the plurality of coolers 118, to each other. With this configuration, the distance between the movable piping portions 127 can be increased. Thus, the distance between the pair of substrates 111 adjacent to each other can be suppressed from becoming a bottleneck depending on the positions at which the movable piping portions 127 are arranged.

In the fourth embodiment, description has been made of the piping 103 having the configuration of connecting the pair of coolers 118, which are apart from each other across two coolers 118 among the plurality of coolers 118, to each other. However, the present invention is not limited thereto, and it is only required that the piping 103 have a configuration of connecting the pair of coolers 118, which are apart from each other across two or more coolers 118 among the plurality of coolers 118, to each other.

Figure 15:
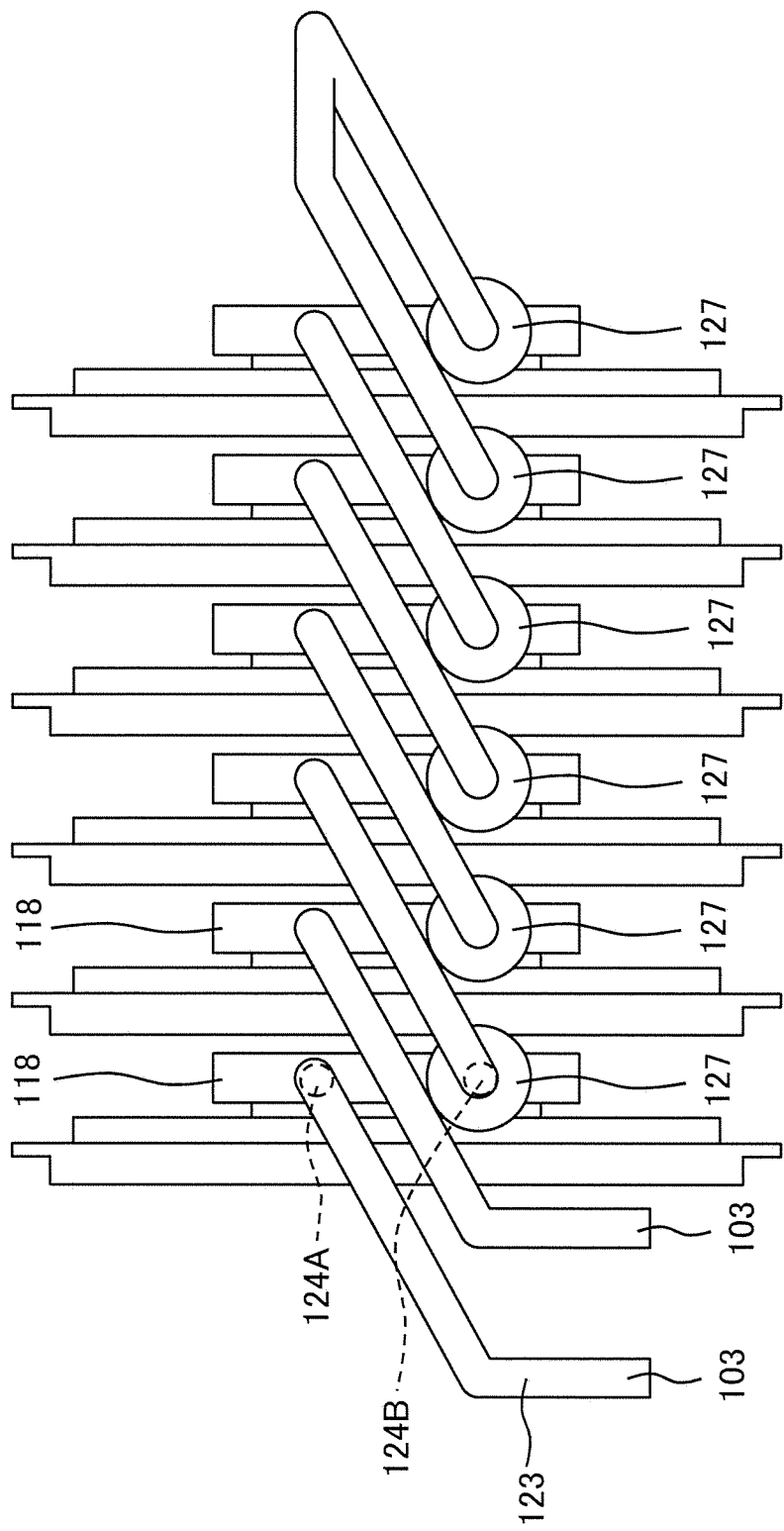
FIG. 15 is a front view for illustrating a modification example of the main part of the electronic device of FIG. 14.

Further, in the fourth embodiment, description has been made of the configuration in which the movable piping portions 127 are overlapped on the second port 124B of the first cooler 118A and the first port 124A of the second cooler 118B of the pair of coolers 118 adjacent to each other when viewed in the direction perpendicular to the side surface of the cooler 118. However, as illustrated in FIG. 15, the movable piping portions 127 may be overlapped on the respective second ports 124B of the plurality of coolers 118 when viewed in the direction perpendicular to the side surface of the cooler 118.

In each of the above-mentioned embodiments, description has been made of the piping 103 connecting the pair of coolers 118 to each other. However, the piping 103 may be connected to one cooler 118.

REFERENCE SIGNS LIST 1 electronic device, 2 entire cooling system, 101 electronic device unit, 102 electronic device cooling system, 103 piping, 104 heat release portion, 105 pump, 106 accumulator, 107 valve, 108 heater, 109 heat transfer sheet, 110 power source, 111 substrate, 112 support member, 113 substrate main body, 114 heat generating element, 115 fastener, 116 electric terminal, 117 support member fixing portion, 118 cooler, 118A first cooler, 118B second cooler, 119 fastener, 120 heat transfer sheet, 121 inner piping portion, 121A first inner piping portion, 121B second inner piping portion, 122 inner piping extending portion, 123 outer piping portion, 124 port, 124A first port, 124B second port, 125 opening portion, 126 curved piping portion, 127 movable piping portion, 201 piping, 202 heat receiving portion, 203 heat release portion, 204 pump, 205 accumulator, 206 valve, 207 heater, 301 earth, 302 orbit, 303 artificial satellite, 304 shade region, 305 sun, 306 heat

The invention claimed is:

1. An electronic device, comprising:
a plurality of substrates each including a substrate main body and a heat generating element provided on the substrate main body, the plurality of substrates being provided side by side in a plate thickness direction of the substrate main body;
a cooler which is provided between the substrates adjacent to each other, and is configured to allow refrigerant to flow through the cooler, to thereby cool the heat generating element; and
a piping which is made of metal, and is connected to the cooler,
wherein the piping includes:
an inner piping portion which is arranged in an inter-substrate region being a region between the substrates adjacent to each other, and is connected to the cooler;
an inner piping extending portion provided so as to extend from the inner piping portion to an outer side of the inter-substrate region; and
an outer piping portion which is arranged to be shifted from the inter-substrate region, and is connected to the inner piping extending portion,
wherein the piping is configured to connect a pair of the coolers to each other,
wherein the outer piping portion includes a movable piping portion that is deformable, and a curved piping portion arranged so as to straddle a side surface of the substrate, and
wherein the movable piping portion is configured to connect the inner piping extending portion and the curved piping portion to each other.

2. The electronic device according to claim 1,
wherein side surfaces of the pair of coolers each have a first port and a second port formed apart from each other in a direction along the substrate,
wherein the piping is configured to connect the first port of a first cooler which is one of the pair of coolers and the second port of a second cooler which is the other of the pair of coolers to each other, and
wherein a distance between the first port of the first cooler and the second port of the second cooler is larger than a distance between the first port of the first cooler and the first port of the second cooler.

3. The electronic device according to claim 1, wherein the cooler is configured to cool the heat generating element with use of latent heat generated when the refrigerant changes from liquid to gas.

4. The electronic device according to claim 1, wherein the piping is configured to connect the pair of coolers, which are apart from each other across two or more coolers among the plurality of coolers provided side by side in the plate thickness direction, to each other.

5. The electronic device according to claim 1, wherein an outer diameter dimension of the movable piping portion is larger than an outer diameter dimension of the inner piping portion.

6. An electronic device, comprising:
a plurality of substrates each including a substrate main body and a heat generating element provided on the substrate main body, the plurality of substrates being provided side by side in a plate thickness direction of the substrate main body;
a cooler which is provided between the substrates adjacent to each other, and is configured to allow refrigerant to flow through the cooler, to thereby cool the heat generating element; and
a piping which is made of metal, and is connected to the cooler, wherein the piping includes:
- an inner piping portion which is arranged in an inter-substrate region being a region between the substrates adjacent to each other, and is connected to the cooler;
- an inner piping extending portion provided so as to extend from the inner piping portion to an outer side of the inter-substrate region; and
- an outer piping portion which is arranged to be shifted from the inter-substrate region, and is connected to the inner piping extending portion, wherein the piping is configured to connect a pair of the coolers to each other, wherein the outer piping portion includes a movable piping portion that is deformable, wherein side surfaces of the pair of coolers each have a first port and a second port formed apart from each other in a direction along the substrate, wherein the piping is configured to connect the first port of a first cooler which is one of the pair of coolers and the second port of a second cooler which is the other of the pair of coolers to each other, wherein a distance between the first port of the first cooler and the second port of the second cooler is larger than a distance between the first port of the first cooler and the first port of the second cooler, and wherein the movable piping portion is arranged so as to be overlapped on any one of the first cooler and the second cooler when viewed in a direction perpendicular to the side surface of the cooler.

* * * * *